(12) United States Patent
Shiota et al.

(10) Patent No.: US 8,889,323 B2
(45) Date of Patent: Nov. 18, 2014

(54) PHOTOSENSITIVE RESIN COMPOSITION

(71) Applicant: Tokyo Ohka Kogyo Co., Ltd., Kawasaki (JP)

(72) Inventors: Dai Shiota, Kawasaki (JP); Mayumi Kuroko, Kawasaki (JP); Tatsuro Ishikawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/140,789

(22) Filed: Dec. 26, 2013

(65) Prior Publication Data
US 2014/0178808 A1   Jun. 26, 2014

(30) Foreign Application Priority Data

Dec. 26, 2012 (JP) ................. 2012-283723

(51) Int. Cl.
*G03F 7/004* (2006.01)
*G03F 7/20* (2006.01)

(52) U.S. Cl.
USPC ......................... 430/19; 430/270.1; 430/325

(58) Field of Classification Search
None
See application file for complete search history.

(56) References Cited

U.S. PATENT DOCUMENTS

| 5,623,023 A * | 4/1997 | Nishikubo | ................. | 525/327.3 |
| 2004/0197698 A1 * | 10/2004 | Tamaki et al. | ............. | 430/270.1 |
| 2005/0266344 A1 * | 12/2005 | Sakurai et al. | ............. | 430/270.1 |

FOREIGN PATENT DOCUMENTS

JP   2001-288364   10/2001

* cited by examiner

*Primary Examiner* — John A. McPherson
(74) *Attorney, Agent, or Firm* — Knobbe Martens Olson & Bear LLP

(57) ABSTRACT

A photosensitive resin composition having excellent storage stability which can form a high precision pattern upon a low amount of exposure; a method of forming a pattern including a polysiloxane coating with the photosensitive resin composition; and an electronic component including a pattern including a polysiloxane coating formed with the photosensitive resin composition. A compound which generates an imidazole compound having a predetermined structure by light is added to a photosensitive resin composition including one or more hydrolyzable silane compounds, hydrolysates of the hydrolyzable silane compounds and condensates thereof and a photo-base generator or a photo-acid generator.

7 Claims, No Drawings

PHOTOSENSITIVE RESIN COMPOSITION

RELATED APPLICATIONS

This application claims priority to Japanese Patent Application No. 2012-283273, filed Dec. 26, 2012, the entire content of which is incorporated herein by reference.

BACKGROUND OF THE INVENTION

1. Field of the Invention

The present invention relates to a photosensitive resin composition comprising a hydrolyzable silane compound, a method of forming a pattern comprising a polysiloxane coating with the photosensitive resin composition and an electronic component comprising a pattern comprising a polysiloxane coating formed by the method.

2. Related Art

In order to manufacture various electronic components and optical components, a photosensitive resin composition comprising a hydrolyzable silane compound is used as a material for forming an insulating member and a light guiding path by the photo lithography method.

Preferably, the foregoing photosensitive resin composition is capable of forming a pattern in excellent precision. For a photosensitive resin composition which meets such demand, for example, a radiation curable resin composition comprising a hydrolyzable silane compound, a photo-acid generator and an acid diffusion inhibitor is known (see Patent Literature 1).

[Patent Document 1] Japanese Unexamined Patent Application, Publication No. 2001-288364

SUMMARY OF THE INVENTION

However, the radiation curable resin composition described in Patent Literature 1 shows poor storage stability. For this reason, when the radiation curable resin composition described in Patent Literature 1 is used for pattern forming after prolonged storage, a pattern with a desired design is difficult to be formed. Further, since the radiation curable resin composition described in Patent Literature 1 contains an acid diffusion inhibitor, an acid generated from a photo-acid generator in the resin composition upon exposure will be neutralized. For this reason, when the resin composition described in Patent Literature 1 is used for pattern formation, a very high amount of exposure is required.

The present invention is made in view of the above problems. An object of the present invention is to provide a photosensitive resin composition having excellent storage stability which can form a pattern in excellent precision by a low amount of exposure. In addition, another object of the present invention is to provide a method of forming a pattern comprising a polysiloxane coating with the photosensitive resin composition. Furthermore, yet another object of the present invention is to provide an electronic component comprising a pattern comprising the polysiloxane coating formed with the photosensitive resin composition.

The present inventors find that the above objects can be achieved by adding (C) a compound which generates an imidazole compound having a specific structure by light to a photosensitive resin composition comprising (A) one or more selected from the group consisting of hydrolyzable silane compounds, hydrolysates of the hydrolyzable silane compounds and condensates thereof and (B) an photo-base generator or a photo-acid generator. Then the present inventors have completed the present invention.

A first aspect of the present invention is a photosensitive resin composition comprising (A) one or more selected from the group consisting of hydrolyzable silane compounds represented by the following general formula:

$$R_nSiX_{4-n} \quad (1)$$

wherein, in the general formula (1), R represents a hydrogen atom or an organic group having 1 to 20 carbon atoms, X represents a hydrolyzable group and n is an integer of 0 to 2, hydrolysates of the hydrolyzable silane compounds and condensates thereof;

(B) a photo-base generator or a photo-acid generator; and (C) a compound which generates an imidazole compound represented by the following general formula by light:

(c1)

wherein, in the general formula (c1), $R^1$, $R^2$ and $R^3$ each independently represents a hydrogen atom, a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group.

A second aspect of the present invention is a method of forming a pattern comprising a polysiloxane coating, the method comprising:

the coating film forming step of applying the photosensitive resin composition according to the first aspect on a substrate to form a coating film, the exposure step of exposing the coating film to a predetermined pattern, and the development step of removing unexposed portions of the coating film for development.

A third aspect of the present invention is an electronic component comprising a pattern comprising the polysiloxane coating formed on a substrate by the method according to the second aspect.

According to the present invention, a photosensitive resin composition having excellent storage stability which can form a pattern in excellent precision by a low amount of exposure can be provided. Further, the present invention can provide a method of forming a pattern comprising a polysiloxane coating using the above photosensitive resin composition. Moreover, according to the present invention, an electronic component comprising a pattern comprising the polysiloxane coating formed with the above photosensitive resin composition can be provided.

DETAILED DESCRIPTION OF THE PREFERRED EMBODIMENTS

Photosensitive Resin Composition

The photosensitive resin composition according to the present invention comprises (A) a hydrolyzable silane compound, hydrolysates of the hydrolyzable silane compound and condensates thereof (hereinafter also referred to as the component (A)), (B) a photo-base generator or a photo-acid generator (hereinafter also referred to as the component (B)) and (C) a compound which generates an imidazole compound by light (hereinafter also referred to as the component (C)). The photosensitive resin composition according to the present invention may optionally comprise (D) a reactive diluent and (E) an organic solvent. Below, components of the photosensitive resin composition will be described in order.

[(A) Hydrolyzable Silane Compounds, Hydrolysates of the Hydrolyzable Silane Compounds and Condensates Thereof]

A photosensitive resin composition comprises (A) one or more selected from the group consisting of hydrolyzable silane compounds represented by the following general formula:

$$R_nSiX_{4-n} \qquad (1)$$

wherein, in the general formula (1), R represents a hydrogen atom or an organic group having 1 to 20 carbon atoms, X represents a hydrolyzable group and n is an integer of 0 to 2, hydrolysates of the hydrolyzable silane compounds and condensates thereof.

Hydrolyzable groups represented by X include an alkoxy group having 1 to 12 carbon atoms, halogen atoms such as chlorine and bromine, an amino group and an acyloxy group having 1 to 12 carbon atoms. Since hydrolyzable silanes represented by the general formula (1) are readily available and show good hydrolyzability, the hydrolysis group is preferably an alkoxy group having 1 to 12 carbon atoms, more preferably an alkoxy group having 1 to 6 carbon atoms, and in particular preferably an alkoxy group having 1 to 4 carbon atoms.

R represents an organic group having 1 to 20 carbon atoms. Examples of the organic group include an alkyl group, an aryl group, an allyl group, a glycidyl group and the like. Among these, an alkyl group and an aryl group are preferred. The number of carbon atoms of the alkyl group is preferably 1 to 5. Specific alkyl groups include a methyl group, an ethyl group, n-propyl group, an isopropyl group, an n-butyl group and the like. The alkyl group may be linear or branched. A hydrogen atom on the alkyl group may be substituted with a fluorine atom. The number of carbon atoms of the aryl group is preferably 6 to 20. The aryl groups include, for example, a phenyl group, a naphthyl group and the like.

Specific examples of the hydrolyzable silane compound represented by the above general formula (1) include the following compounds.

((a1) In the Case of n=0)

In the case of n=0, suitable examples of the hydrolyzable silane compound represented by the above general formula (1) include tetramethoxysilane, tetraethoxysilane, tetrapropoxysilane, tetrabutoxysilane and the like.

((a2) In the Case of n=1)

In the case of n=1, suitable examples of the hydrolyzable silane compound represented by the above general formula (1) include monoalkyltrialkoxysilanes such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane and monopropyltriethoxysilane; monophenyltrialkoxysilanes such as monophenyltrimethoxysilane and monophenyltriethoxysilane and the like.

((a3) In the Case of n=2)

In the case of n=2, hydrolyzable silane compounds represented by the above general formula (1) can include dialkyldialkoxysilanes such as dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane and dipropyldipropoxysilane; diphenyldialkoxysilanes such as diphenyldimethoxysilane and diphenyldiethoxysilane and the like.

Hydrolysates of the hydrolyzable silane compound represented by the above general formula (1) can be obtained by hydrolyzing the hydrolyzable silane compound represented by the above general formula (1) in an organic solvent in the presence of an acid catalyst or a base catalyst according to the conventional method. When hydrolyzing the hydrolyzable silane compound, a single species of the hydrolyzable silane compound may be used, or a mixture of two or more may be used. The amount of water when hydrolyzing the hydrolyzable silane compound is preferably 1.0 to 10.0 times in terms of moles relative to the total moles of the hydrolyzable silane compound, and more preferably 1.5 to 8.0 times in terms of moles. Addition of 1.0 time or more of water in moles allows the hydrolyzable silane compound to be hydrolyzed at a sufficiently rapid rate.

Acid catalysts are preferably used as a catalyst used for the hydrolysis reaction. There is no particular limitation for the acid catalyst used for the hydrolysis reaction, and either organic acids or inorganic acids conventionally used as acid catalyst can be used. For organic acids, organic carboxylic acids such as acetic acid, propionic acid and butyric acid can be used. Inorganic acids can include hydrochloric acid, nitric acid, sulfuric acid, phosphoric acid and the like. An acid catalyst may be added directly into a mixture of the hydrolyzable silane compound and water, or may be added as an acidic aqueous solution along with water.

The hydrolysis reaction of the hydrolyzable silane compound is usually completed in about 5 to 100 hours at the room temperature. The hydrolysis reaction may be completed in a short reaction time by hydrolyzing one or more hydrolyzable silane compounds represented by the above general formula (1) in an organic solvent at a temperature higher than the room temperature in the presence of an acid catalyst or a base catalyst.

Condensates of the hydrolyzable silane are generated by the dehydration-condensation reaction of silanol groups with respect to one another by further continuing the reaction after the hydrolysis reaction of the hydrolyzable silane. In the case of forming condensates of hydrolyzable silane, to the hydrolyzable silane represented by the general formula (1) used as a raw material, trialkylalkoxysilanes such as trimethylmethoxysilane, trimethylethoxysilane, trimethylpropoxysilane, triethylmethoxysilane, triethylethoxysilane, triethylpropoxysilane, tripropylmethoxysilane and tripropylethoxysilane; triphenylalkoxysilanes such as triphenylmethoxysilane and triphenylethoxysilane and the like may be added at the time of hydrolysis. Water used for the hydrolytic condensation reaction and alcohol produced as a by-product may be removed after the reaction if desired.

The average molecular weight of hydrolyzed condensates of hydrolyzable silane is preferably 200 to 50000, more preferably 500 to 30000, and in particular preferably 500 to 10000. The average molecular weight of condensates of hydrolyzable silane can be determined as a molecular weight of equivalent polystyrene by gel filtration chromatography.

[(B) Photo-Base Generator or Photo-Acid Generator]

The photosensitive resin composition comprises (B) a photo-base generator or a photo-acid generator. In a case where the photosensitive resin composition comprises the component (B), the condensation of the component (A) is further promoted, the condensation being promoted by an imidazole compound generated from the component (C) as described below when the photosensitive resin composition is exposed. For this reason, in a case where the component (B) is compounded with the photosensitive resin composition, the photosensitive resin composition well undergoes curing by a low amount of exposure, and a pattern having a desired design is easily formed. Below, a photo-base generator and a photo-acid generator are described in order.

(Photo-Base Generator)

There is no particular limitation for the photo-base generators as long as they are a compound which generates a base by the action of light. They can be appropriately selected from the photo-base generators conventionally used for various applications. Note that the component (C) described below shall not be included in the photo-base generators within the scope of the specification and claims of the present application. For the photo-base generator, an oxime ester-based photo-base generator is preferred since it can easily enhance the effect in which the condensation of the component (A) of the imidazole compound generated from the component (C) is facilitated. When an oxime ester-based photo-base generator is exposed, imine is generated as a base, which further enhances the effect in which the condensation of the component (A) of the imidazole compound is facilitated.

Among oxime ester compounds, compounds represented by the following general formula (b1) are preferred.

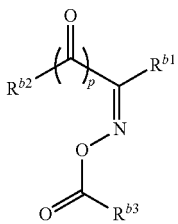

(b1)

In the above general formula (b1), $R^{b1}$ represents an alkyl group having 1 to 10 carbon atoms, an optionally substituted phenyl group or an optionally substituted carbazolyl group. p is 0 or 1. $R^{b2}$ represents an optionally substituted alkyl group having 1 to 10 carbon atoms or an optionally substituted phenyl group. $R^{b3}$ represents a hydrogen atom, an alkyl group having 1 to 6 carbon atoms or an optionally substituted phenyl group.

In a case where $R^{b1}$ is an alkyl group having 1 to 10 carbon atoms, the alkyl group may be linear or branched. In this case, the alkyl group preferably has 1 to 8 carbon atoms, more preferably 1 to 5 carbon atoms.

In a case where $R^{b1}$ is an optionally substituted phenyl group, there is no particular limitation for substituents as long as they do not interfere with the object of the present invention. Suitable examples of the substituents which a phenyl group may have include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with 1 or 2 organic groups, a morpholine-1-yl group, and a piperazine-1-yl group, halogen, a nitro group, and a cyano group and the like. When $R^{b1}$ is an optionally substituted phenyl group, and the phenyl group has two or more substituents, the two or more substituents may be the same, or may be different.

In a case where a substituent on the phenyl group is an alkyl group, the number of carbon atoms on the substituent is preferably 1 to 20, more preferably 1 to 10, even more preferably 1 to 6, in particular preferably 1 to 3, and most preferably 1. The alkyl group may be linear or branched. In a case where a substituent on the phenyl group is an alkyl group, specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. The alkyl group may include an ether bond (—O—) in the carbon chain. In this case, substituents in the phenyl group include, for example, an alkoxyalkyl group and an alkoxyalkoxyalkyl group. In a case where a substituent on the phenyl group is an alkoxyalkyl group, a group represented by —$R^{b4}$—O—$R^{b5}$ is preferred. $R^{b4}$ is an alkylene group having 1 to 10 carbon atoms which may be linear or branched. $R^{b5}$ is an alkyl group having 1 to 10 carbon atoms which may be linear or branched. The number of carbon atoms of $R^{b4}$ is preferably 1 to 8, more preferably 1 to 5 and in particular preferably 1 to 3. The number of carbon atoms of $R^{b5}$ is preferably 1 to 8, more preferably 1 to 5, in particular preferably 1 to 3 and most preferably 1. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where a substituent on the phenyl group is an alkoxy group, the number of carbon atoms on the substituent is preferably 1 to 20, more preferably 1 to 6. The alkoxy group may be linear chain or branched. In a case where a substituent on the phenyl group is an alkoxy group, specific examples of the alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. The alkoxy group may include an ether bond (—O—) in the carbon chain. Examples of the alkoxy group having an ether bond in the carbon chain include a methoxyethoxy group, an ethoxyethoxy group, a 2-methoxy-1-methylethoxy group, a methoxyethoxyethoxy group, an ethoxyethoxyethoxy group, a propyloxyethoxyethoxy group, a methoxypropyloxy group and the like.

In a case where a substituent on the phenyl group is a cycloalkyl group or a cycloalkoxy group, the number of carbon atoms on the substituent is preferably 3 to 10, more preferably 3 to 6. In a case where a substituent on the phenyl group is a cycloalkyl group, specific examples of the cycloalkyl group include a cyclopropyl group, a cyclobutyl group, a cyclopentyl group, a cyclohexyl group, a cycloheptyl group, a cyclooctyl group and the like. In a case where a substituent on the phenyl group is a cycloalkoxy group, specific examples of the cycloalkoxy group include a cyclopropyloxy group, a cyclobutyloxy group, a cyclopentyloxy group, a cyclohexyloxy group, a cycloheptyloxy group, a cyclooctyloxy group and the like.

In a case where a substituent on the phenyl group is a saturated aliphatic acyl group or a saturated aliphatic acyloxy group, the number of carbon atoms on the substituent is preferably 2 to 20, more preferably 2 to 7. In a case where a substituent on the phenyl group is a saturated aliphatic acyl group, specific examples of the saturated aliphatic acyl group include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where a substituent on the phenyl group is a saturated aliphatic acyloxy group, specific examples of the saturated aliphatic acyloxy group include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where a substituent on the phenyl group is an alkoxycarbonyl group, the number of carbon atoms on the substituent is preferably 2 to 20, more preferably 2 to 7. In a case where a substituent on the phenyl group is an alkoxycarbonyl group, specific examples of the alkoxycarbonyl group include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where a substituent on the phenyl group is a phenylalkyl group, the number of carbon atoms on the substituent is preferably 7 to 20, more preferably 7 to 10. In a case where a substituent on the phenyl group is a naphthylalkyl group, the number of carbon atoms on the substituent is preferably 11 to 20, more preferably 11 to 14. In a case where a substituent on the phenyl group is a phenylalkyl group, specific examples of the phenylalkyl group include a benzyl group, a 2-phenylethyl group, a 3-phenylpropyl group and a 4-phenylbutyl group. In a case where a substituent on the phenyl group is a naphthylalkyl group, specific examples of the naphthylalkyl group include an α-naphthylmethyl group, a β-naphthylmethyl group, a 2-(α-naphthyl)ethyl group and a 2-(β-naphthyl)ethyl group. In a case where a substituent on the phenyl group is a phenylalkyl group or a naphthylalkyl group, the substituent may further have a substituent on the phenyl group or the naphthyl group.

In a case where a substituent on the phenyl group is a heterocyclyl group, the heterocyclyl group is a 5 or 6-membered monocyclic ring having one or more N, S and O, or a heterocyclyl group in which the above monocyclic rings are condensed together, or the above monocyclic ring and a benzene ring are condensed. In a case where the heterocyclyl group is a condensed ring, the number of rings shall be up to 3. Heterocyclic rings comprising the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline and the like. In a case where a substituent on the phenyl group is a heterocyclyl group, the heterocyclyl group may further have a substituent.

In a case where a substituent on the phenyl group is an amino group substituted with 1 or 2 organic groups, suitable examples of the organic group include an alkyl group having 1 to 20 carbon atoms, a cycloalkyl group having 3 to 10 carbon atoms, a saturated aliphatic acyl group having 2 to 20 carbon atoms, a saturated aliphatic acyloxy group having 2 to 20 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Specific examples of these suitable organic groups similarly include those described for the substituents on the phenyl group. Specific examples of the amino group substituted with 1 or 2 organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, n-pentanoylamino group, an n-hexanoylamino group, an n-heptanoylamino group, an n-octanoylamino group, an n-decanoylamino group, a benzoylamino group, an α-naphthoylamino group, a β-naphthoylamino group, an N-acetyl-N-acetyloxyamino group and the like.

In a case where the phenyl group, the naphthyl group and the heterocyclyl group included in the substituent on the phenyl group further have a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having an alkyl group with 1 to 6 carbon atoms, a morpholine-1-yl group, a piperazine-1-yl group, halogen, a nitro group, a cyano group and the like. In a case where the phenyl group, the naphthyl group and the heterocyclyl group included in the substituent on the phenyl group further have a substituent, the number of the substituent is preferably, but not limited to, 1 to 4 as long as it does not interfere with the object of the present invention. In a case where the phenyl group, the naphthyl group and the heterocyclyl group included in the substituent on the phenyl group have two or more substituents, the two or more substituents may be the same, or may different.

Substituents in a case where $R^{b1}$ is an optionally substituted phenyl group are described in the above. Nonetheless, among these substituents, an alkyl group or an alkoxyalkyl group is preferred.

In a case where $R^{b1}$ is an optionally substituted phenyl group, there is no particular limitation for the number of substituents and a position at which a substituent is attached as long as they do not interfere with the object of the present invention. In a case where $R^{b1}$ is an optionally substituted phenyl group, the optionally substituted phenyl group is preferably an optionally substituted o-tolyl group in view of excellent efficacy of base generation.

In a case where $R^{b1}$ is an optionally substituted carbazolyl group, there is no particular limitation for substituents as long as they do not interfere with the object of the present invention. Examples of suitable substituents which the carbazolyl group may have on the carbon atom include an alkyl group having 1 to 20 carbon atoms, an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, an optionally substituted phenyl group, an optionally substituted phenoxy group, an optionally substituted phenylthio group, an optionally substituted phenylcarbonyl group, an optionally substituted benzoyl group, an optionally substituted phenoxycarbonyl group, an optionally substituted benzoyloxy group, an optionally substituted phenylalkyl group having 7 to 20 carbon atoms, an optionally substituted naphthyl group, an optionally substituted naphthoxy group, an optionally substituted naphthylcarbonyl group, an optionally substituted naphthoyl group, an optionally substituted naphthoxycarbonyl group, an optionally substituted naphthoyloxy group, an optionally substituted naphthylalkyl group having 11 to 20 carbon atoms, an optionally substituted heterocyclyl group, an optionally substituted heterocyclylcarbonyl group, an amino group, an amino group substituted with 1 or 2 organic groups, a morpholine-1-yl group, a piperazine-1-yl group, halogen, a nitro group, a cyano group and the like.

In a case where $R^{b1}$ is an optionally substituted carbazolyl group, examples of suitable substituent which the carbazolyl group may have on the nitrogen atom include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like. Among these substituents, an alkyl group having 1 to 20 carbon atoms is preferred, and an alkyl group having 1 to 6 carbon atoms is more preferred, and in particular an ethyl group is preferred.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group and an amino group substituted with 1 or 2 organic groups, specific examples of optional substituents on the carbazolyl group are similar to the examples of the substituents on the phenyl group in a case where $R^{b1}$ is an optionally substituted phenyl group.

In $R^{b1}$, in a case where the phenyl group, the naphthyl group, and the heterocyclyl group included in the substituent on the carbazolyl group further have a substituent, examples of the substituent include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted with a group selected from the group consisting of an alkyl group having 1 to 6 carbon atoms, a morpholine-1-yl group, a piperazine-1-yl group and a phenyl group; a monoalkylamino group having an alkyl group with 1 to 6 carbon atoms; a dialkylamino group having alkyl groups with 1 to 6 carbon atoms; a morpholine-1-yl group; a piperazine-1-yl group; halogen; a nitro group; and a cyano group. In a case where the phenyl group, the naphthyl group and the heterocyclyl group included in the substituent on the carbazolyl group further have a substituent, the number of substituents is not limited as long as it does not interfere with the object of the present invention, but it is preferably 1 to 4. In a case where the phenyl group, the naphthyl group and the heterocyclyl group have two or more substituents, the two or more substituents may be the same, or may be different.

$R^{b2}$ represents an optionally substituted alkyl group having 1 to 10 carbon atoms or an optionally substituted phenyl group.

In a case where $R^{b2}$ is an optionally substituted alkyl group having 1 to 10 carbon atoms, the alkyl group may be linear or branched. In this case, the alkyl group preferably has 1 to 8 carbon atoms, more preferably 1 to 5 carbon atoms.

In $R^{b2}$, there is no particular limitation for the substituents on the alkyl group or the phenyl group as long as they do not interfere with the object of the present invention.

Examples of suitable substituents which the alkyl group may have on the carbon atoms include an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 to 20 carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 to 20 carbon atoms, an optionally substituted heterocyclyl group, an optionally substituted heterocyclylcarbonyl group, an amino group, an amino group substituted with 1 or 2 organic groups, a morpholine-1-yl group, and a piperazine-1-yl group, halogen, a nitro group, a cyano group and the like.

Examples of suitable substituents which the phenyl group may have on the carbon atoms include an alkyl group having 1 to 20 carbon atoms in addition to those groups exemplified above as the suitable substituents which the alkyl group may have on the carbon atoms.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group, and an amino group substituted with 1 or 2 organic groups, specific examples of optional substituents on the alkyl group or the phenyl group is similar to the examples of the substituents on the phenyl group in a case where $R^{b1}$ is an optionally substituted phenyl group.

In $R^{b2}$, in a case where the phenyl group, the naphthyl group and the heterocyclyl group included in the alkyl group or the phenyl group further have a substituent, examples of the substituent include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted with a group selected from the group consisting of an alkyl group having 1 to 6 carbon atoms, a morpholine-1-yl group, a piperazine-1-yl group and a phenyl group; a monoalkylamino group having an alkyl group with 1 to 6 carbon atoms; a dialkylamino group having alkyl groups with 1 to 6 carbon atoms; a morpholine-1-yl group; a piperazine-1-yl group; halogen; a nitro group; and a cyano group. In a case where the phenyl group, the naphthyl group and the heterocyclyl group included in substituent on the alkyl group or the phenyl group further have a substituent, the number of the substituent is preferably, but not limited to, 1 to 4 as long as it does not interfere with the object of the present invention. In a case where the phenyl group, the naphthyl group and the heterocyclyl group have two or more substituents, the two or more substituents may be the same, or may be different.

In view of efficacy of base generation of the compound represented by the general formula (b1), a group represented by the following general formula (b2) is preferred for $R^{b1}$:

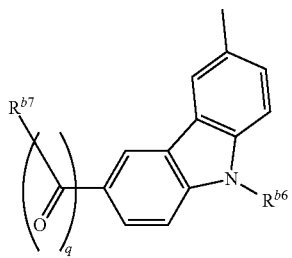

(b2)

and a group represented by the following general formula (b3) is preferred for $R^{b2}$:

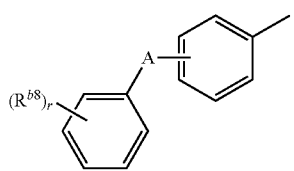

(b3)

In the general formula (b2), $R^{b6}$ and $R^{b7}$ are each a monovalent organic group, and q is 0 or 1. In the general formula (b3), $R^{b8}$ is a group selected from the group consisting of a monovalent organic group, an amino group, halogen, a nitro group and a cyano group, and A is S or O, and r is an integer of 0 to 4.

$R^{b6}$ in the general formula (b2) can be selected from various organic groups as long as they do not interfere with the object of the present invention. Suitable examples of $R^{b6}$ include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like.

Among these, $R^{b6}$ is preferably an alkyl group having 1 to 20 carbon atoms, more preferably an alkyl group having 1 to 6 carbon atoms, and in particular preferably an ethyl group.

There is no particular limitation for $R^{b7}$ in the general formula (b2) as long as they do not interfere with the object of the present invention, and it can be selected from various organic groups. Specific examples of the suitable group for $R^{b7}$ include an alkyl group having 1 to 20 carbon atoms, an optionally substituted phenyl group, an optionally substituted naphthyl group and an optionally substituted heterocyclyl group. Among these groups, $R^{b7}$ is more preferably an optionally substituted phenyl group and an optionally substituted naphthyl group, and in particular preferably a 2-methylphenyl group and a naphthyl group.

In a case where the phenyl group, the naphthyl group and the heterocyclyl group included in $R^{b6}$ or $R^{b7}$ further have a substituent, substituents include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholine-1-yl group, a piperazine-1-yl group, halogen, a nitro group, a cyano group and the like. In a case where the phenyl group, the naphthyl group and the heterocyclyl group included in $R^{b6}$ or $R^{b7}$ further have a substituent, there is no particular limitation for the number of the substituent as long as it does not interfere with the object of the present invention, but it is preferably 1 to 4. In a case where the phenyl group, the naphthyl group and the heterocyclyl group included in $R^{b6}$ or $R^{b7}$ have two or more substituents, the two or more substituents may be the same, or may be different.

In a case where $R^{b8}$ in the general formula (b3) is an organic group, $R^{b8}$ can be selected from various organic groups as long as it does not interfere with the object of the present invention. In a case where $R^{b8}$ in the general formula (b3) is an organic group, suitable examples of $R^{b8}$ include an alkyl group having 1 to 6 carbon atoms; an alkoxy group having 1 to 6 carbon atoms; a saturated aliphatic acyl group having 2 to 7 carbon atoms; an alkoxycarbonyl group having 2 to 7 carbon atoms; a saturated aliphatic acyloxy group having 2 to 7 carbon atoms; a phenyl group; a naphthyl group; a benzoyl group; a naphthoyl group; a benzoyl group substituted with a group selected from the group consisting of an alkyl group having 1 to 6 carbon atoms, a morpholine-1-yl group, a piperazine-1-yl group and a phenyl group; a monoalkylamino group having an alkyl group with 1 to 6 carbon atoms; a dialkylamino group having alkyl groups with 1 to 6 carbon atoms; a morpholine-1-yl group; a piperazine- 1-yl group; halogen; a nitro group; a cyano group; a 2-methylphenylcarbonyl group; a 4-(piperazine-1-yl)phenylcarbonyl group; and a 4-(phenyl)phenylcarbonyl group.

Among these, $R^{b8}$ is preferably a benzoyl group; a naphthoyl group; a benzoyl group substituted with a group selected from the group consisting of an alkyl group having 1 to 6 carbon atoms, a morpholine-1-yl group, a piperazine-1-yl group and a phenyl group; and a nitro group, and is more preferably a benzoyl group; a naphthoyl group; a 2-methylphenylcarbonyl group; a 4-(piperazine-1-yl)phenylcarbonyl group; and a 4-(phenyl)phenylcarbonyl group.

In the general formula (b3), r is preferably an integer of 0 to 3, more preferably an integer of 0 to 2, and in particular preferably 0 or 1. When r is 1, $R^{b8}$ is preferably attached at a position para to the atomic bonding where the phenyl group to which $R^{b8}$ is attached is attached to the sulfur atom.

$R^{b3}$ represents a hydrogen atom, an alkyl group having 1 to 6 carbon atoms or an optionally substituted phenyl group. For an optionally substituted phenyl group, optional substituents on the phenyl group are similar to those in a case where $R^{b1}$ is an optionally substituted phenyl group. For $R^{b3}$, a methyl group, an ethyl group or a phenyl group is preferred, and a methyl group or a phenyl group is more preferred.

The oxime ester compound represented by the above general formula (b1) wherein p is 0 can be synthesized, for example, by the method described below. First, a ketone compound represented by $R^{b2}$—CO—$R^{b1}$ is subjected to oximation with hydroxylamine to obtain an oxime compound represented by $R^{b2}$—(C=N—OH)—$R^{b1}$. Subsequently, the resulting oxime compound is acylated with an acid halide represented by $R^{b3}$—CO-Hal (Hal represents halogen) and an acid anhydride represented by $(R^{b3}CO)_2O$ to obtain an oxime ester compound represented by the above general formula (b1) wherein p is 0.

The oxime ester compound represented by the above general formula (b1) wherein p is 1 can be synthesized, for example, by the method described below. First, a ketone compound represented by $R^{b2}$—CO—CH$_2$—$R^{b1}$ is allowed to react with a nitrous ester in the presence of hydrochloric acid to obtain an oxime compound represented by $R^{b2}$—CO—(C=N—OH)—$R^{b1}$. Subsequently, the resulting oxime compound is acylated with an acid halide represented by $R^{b3}$—CO-Hal (Hal represents halogen) and an acid anhydride represented by $(R^{b3}CO)_2O$ to obtain an oxime ester compound represented by the above general formula (b1) wherein p is 1.

Compounds represented by the above general formula (b1) include compounds represented by the following general formula (b4).

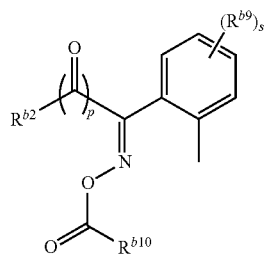

(b4)

In the above general formula (b4), p and $R^{b2}$ are as described above. $R^{b9}$ is a group selected from the group consisting of a monovalent organic group, an amino group, halogen, a nitro group and a cyano groups, and s is an integer of 0 to 4, and $R^{b10}$ represents a hydrogen atom or an alkyl group having 1 to 6 carbon atoms.

In the above general formula (b4), there is no particular limitation for $R^{b9}$ as long as it does not interfere with the object of the present invention, but in the case of an organic group, it is appropriately selected from various organic groups. Suitable examples of $R^{b9}$ include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with 1 or 2 organic groups, a morpholine-1-yl group, a piperazine-1-yl group, halogen, a nitro group, a cyano group and the like. When s is an integer of 2 to 4, $R^{b9}$ may be the same or may be different. The number of carbon atoms of a substituent does not include the number of carbon atoms of an additional substituent which the substituent further has.

In a case where $R^{b9}$ is an alkyl group, the number of carbon atoms is preferably 1 to 20, and more preferably the number of carbon atoms is 1 to 6. In a case where $R^{b9}$ is an alkyl group, $R^{b9}$ may be linear or branched. In a case where $R^{b9}$ is an alkyl group, specific examples of $R^{b9}$ include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. In a case where $R^{b9}$ is an alkyl group, the alkyl group may include an ether bond (—O—) in the carbon chain. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where $R^{b9}$ is an alkoxy group, the number of carbon atoms is preferably 1 to 20, and more preferably the number of carbon atoms is 1 to 6. In a case where $R^{b9}$ is an alkoxy group, $R^{b9}$ may be linear or branched. In a case where $R^{b9}$ is an alkoxy group, specific examples of $R^{b9}$ include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. In a case where $R^{b9}$ is an alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group and the like.

In a case where $R^{b9}$ is a cycloalkyl group or a cycloalkoxy group, the number of carbon atoms is preferably 3 to 10, and more preferably the number of carbon atoms is 3 to 6. In a case where $R^{b9}$ is a cycloalkyl group, specific examples of $R^{b9}$ include a cyclopropyl group, a cyclobutyl group, a cyclopentyl group, a cyclohexyl group, a cycloheptyl group, a cyclooctyl group and the like. In a case where $R^{b9}$ is a cycloalkoxy group, specific examples of $R^{b9}$ include a cyclopropyloxy group, a cyclobutyloxy group, a cyclopentyloxy group, a cyclohexyloxy group, a cycloheptyloxy group, a cyclooctyloxy group and the like.

In a case where $R^{b9}$ is a saturated aliphatic acyl group or a saturated aliphatic acyloxy group, the number of carbon atoms is preferably 2 to 20, and more preferably the number of carbon atoms is 2 to 7. In a case where $R^{b9}$ is a saturated aliphatic acyl group, specific examples of $R^{b9}$ include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where $R^{b9}$ is a saturated aliphatic acyloxy group, specific examples of $R^{b9}$ include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where $R^{b9}$ is an alkoxycarbonyl group, the number of carbon atoms is preferably 2 to 20, and more preferably the number of carbon atoms is 2 to 7. In a case where $R^{b9}$ is an alkoxycarbonyl group, specific examples of $R^{b9}$ include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where $R^{b9}$ is a phenylalkyl group, the number of carbon atoms is preferably 7 to 20, and more preferably the number of carbon atoms is 7 to 10. In a case where $R^{b9}$ is a naphthylalkyl group, the number of carbon atoms is preferably 11 to 20, and more preferably the number of carbon atoms is 11 to 14. In a case where $R^{b9}$ is a phenylalkyl group, specific examples of $R^{b9}$ include a benzyl group, a 2-phenylethyl group, a 3-phenylpropyl group and a 4-phenylbutyl group. In a case where $R^{b9}$ is a naphthylalkyl group, specific examples of $R^{b9}$ include an α-naphthylmethyl group, a β-naphthylmethyl group, a 2-(α-naphthyl)ethyl group and a 2-(β-naphthyl)ethyl group. In a case where $R^{b9}$ is a phenylalkyl group or a naphthylalkyl group, $R^{b9}$ may further have a substituent on the phenyl group or the naphthyl group.

In a case where $R^{b9}$ is a heterocyclyl group, the heterocyclyl group is a 5- or 6-membered monocyclic ring having one or more N, S and O, or is a heterocyclyl group in which the above monocyclic rings are condensed together, or the above monocyclic ring and a benzene ring are condensed. In a case where the heterocyclyl group is a condensed ring, the number of rings shall be up to 3. Heterocyclic rings comprising the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazol, benzoxazole, benzothiazole, carbazole, purine, quinoline, isoquinoline, quinazoline, phthalazine, cinnoline, quinoxaline and the like. In a case where $R^{b9}$ is a heterocyclyl group, the heterocyclyl group may further have a substituent.

In a case where $R^{b9}$ is an amino group substituted with 1 or 2 organic groups, suitable examples of the organic group include an alkyl group having 1 to 20 carbon atoms, a cycloalkyl group having 3 to 10 carbon atoms, a saturated aliphatic acyl group having 2 to 20 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Examples of these suitable organic groups are similar to those of $R^{b9}$. Specific examples of the amino group substituted with 1 or 2 organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, n-pentanoylamino group, an n-hexanoylamino group, an n-heptanoylamino group, an n-octanoylamino group, an n-decanoylamino group, a benzoylamino group, an α-naphthoylamino group, a β-naphthoylamino group and the like.

In a case where the phenyl group, the naphthyl group and the heterocyclyl group included in $R^{b9}$ further have a substituent, substituents include an alkyl group have 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholine-1-yl group, a piperazine-1-yl group, halogen, a nitro group, a cyano group and the like. In a case where the phenyl group, the naphthyl group and the heterocyclyl group included in $R^{b9}$ further have a substituent, there is no particular limitation for the number of the substituents as long as it does not interfere with the object of the present invention, but it is preferably 1 to 4. In a case where the phenyl group, the naphthyl group and the heterocyclyl group included in $R^{b9}$ have two or more substituents, the two or more substituents may be the same, or may be different.

For $R^{b9}$, a group selected from the group consisting of an alkyl group having 1 to 6 carbon atoms, an alkoxy group having 1 to 6 carbon atoms and a saturated aliphatic acyl group having 2 to 7 carbon atoms is preferred, alkyl having 1 to 6 carbon atoms is more preferred, and a methyl group is particularly preferred because they are chemically stable and show little steric hindrance, and the synthesis of an oxime ester compound is easy.

A position at which $R^{b9}$ is attached to the phenyl group is preferably position 4 or 5, more preferably position 5 when the position of atomic bonding of the phenyl group to the backbone of an oxime ester compound is taken as position 1, and the position of the methyl group is taken as position 2.

s is preferably an integer of 0 to 3, more preferably an integer of 0 to 2, and in particular preferably 0 or 1.

$R^{b10}$ in the above general formula (b4) is a hydrogen atom or an alkyl group having 1 to 6 carbon atoms. For $R^{b10}$, a methyl group or an ethyl group is preferred, and a methyl group is more preferred.

Specific examples of the particularly suitable compound as a photo-base generator used as the component (B) are shown below.

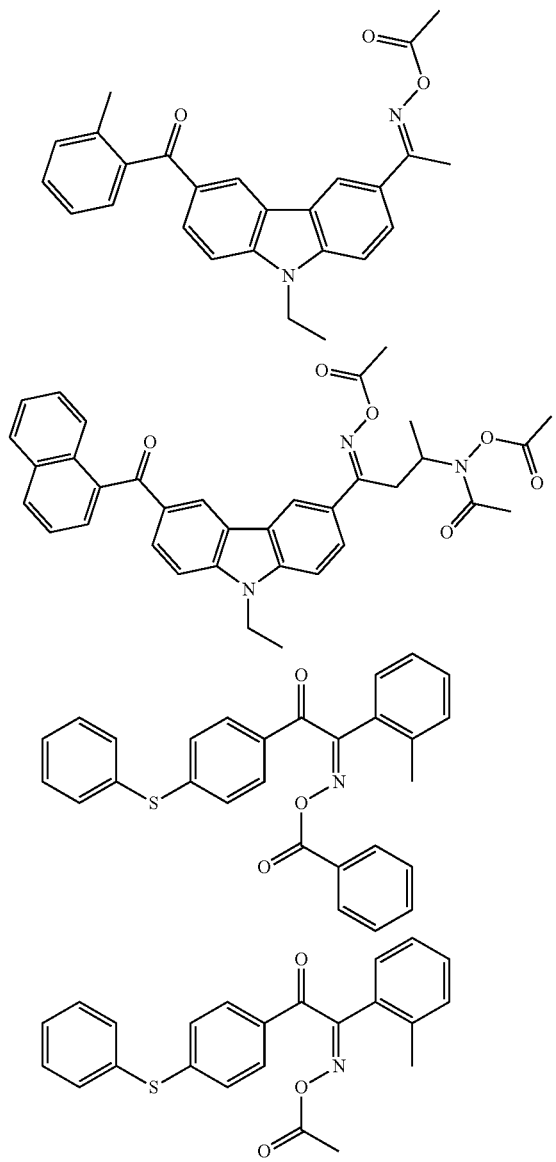

(Photo-Acid Generator)

There is no particular limitation for the photo-acid generator, and any photo-acid generators conventionally used for various applications which generate acid by exposure to active light or by exposure to radiation can be used. For the photo-acid generators, the acid generators according to the first to fifth aspects described below are preferred. Below, suitable photo-acid generators among these will be described as the first to fifth aspects.

The photo-acid generators according to the first aspect include a compound represented by the following general formula (b5).

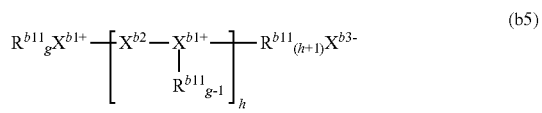

(b5)

In the above general formula (b5), $X^{b1}$ represents a sulfur atom or iodine atom having a valence of g, and g is 1 or 2. h represents the number of the repeating unit represented by the structure in parentheses. $R^{b11}$, which is an organic group attached to $X^{b1}$, represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{b11}$ may be substituted with at least one selected from the group consisting of each group of alkyl, hydroxy, alkoxy, alkylcarbonyl, arylcarbonyl, alkoxycarbonyl, aryloxycarbonyl, arylthiocarbonyl, acyloxy, arylthio, alkylthio, aryl, heterocyclic rings, aryloxy, alkylsulfinyl, arylsulfinyl, alkylsulfonyl, arylsulfonyl, alkyleneoxy, amino, cyano and nitro; and halogen. The number of $R^{b11}$ is g+h(g−1)+1, and $R^{b11}$ may be the same or different from each other. Two or more $R^{b11}$ may be attached to each other directly or via —O—, —S—, —SO—, —SO$_2$—, —NH—, —NR$^{b12}$—, —CO—, —COO—, —CONH—, an alkylene group having 1 to 3 carbon atoms, or a phenylene group to form a ring structure which includes $X^{b1}$. $R^{b12}$ is an alkyl group having 1 to 5 carbon atoms, or an aryl group having 6 to 10 carbon atoms.

$X^{b2}$ has a structure represented by the following general formula (b6).

(b6)

$X^{b4}$ in the above general formula (b6) represents an alkylene group having 1 to 8 carbon atoms, an arylene group having 6 to 20 carbon atoms or a divalent group of a heterocyclic compound having 8 to 20 carbon atoms. $X^{b4}$ may be substituted with at least one selected from the group consisting of each group of alkyl having 1 to 8 carbon atoms, alkoxy having 1 to 8 carbon atoms, aryl having 6 to 10 carbon atoms, hydroxy, cyano and nitro; and halogen. $X^{b5}$ represents —O—, —S—, —SO—, —SO$_2$—, —NH—, —CO—, —COO—, —CONH—, an alkylene group having 1 to 3 carbon atoms or a phenylene group. h represents the number of the repeating unit represented by the structure in parentheses. h+1 units of $X^{b4}$ and h units of $X^{b5}$ may be the same or different from each other. $R^{b12}$ has the same definition as described above.

$X^{b3-}$ is a counter ion for the onium, and examples of $X^{b3-}$ include a fluorinated alkylfluorophosphoric acid anion represented by the following general formula (b21) or a borate anion represented by the following general formula (b22).

(b21)

In the above general formula (b21), $R^{b13}$ represents an alkyl group in which 80% or more of the hydrogen atoms are substituted with fluorine atoms. j represents the number of $R^{b13}$, and is an integer of 1 to 5. j units of $R^{b13}$ may be the same or different from each other.

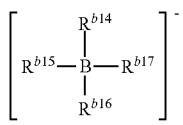

(b22)

In the above general formula (b22), $R^{b14}$ to $R^{b17}$ each independently represents a fluorine atom or a phenyl group, and some or all of the hydrogen atoms on the phenyl group may be substituted with at least one selected from the group consisting of a fluorine atom and a trifluoromethyl group.

Onium ions in the compounds represented by the above general formula (b5) include triphenylsulfonium, tri-p-tolyl-sulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(diphenyl)sulfonio]thioxantone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxypheny)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium or the like.

Among the onium ions in the compounds represented by the above general formula (b5), preferred onium ions include sulfonium ions represented by the following general formula (b23).

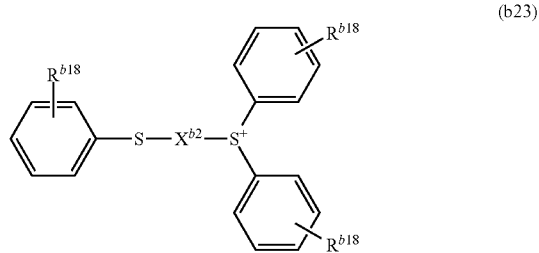

(b23)

In the above general formula (b23), $R^{b18}$ each independently represents a group selected from the group consisting of a hydrogen atom, alkyl, hydroxy, alkoxy, alkylcarbonyl, alkylcarbonyloxy, alkyloxycarbonyl, a halogen atom, optionally substituted aryl and arylcarbonyl. $X^{b2}$ has the same meaning as $X^{b2}$ in the above general formula (b5).

Specific examples of the sulfonium ion represented by the above general formula (b23) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium and diphenyl[4-(β-terphenylthio)phenyl]diphenylsulfonium.

In the fluorinated alkylfluorophosphoric acid anion represented by the above general formula (b21), $R^{b13}$ represents an alkyl group substituted with a fluorine atom, and the number of carbon atoms is preferably 1 to 8, and more preferably the number of carbon atoms is 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl. They further include cycloalkyl groups such as cyclopropyl, cyclobutyl, cyclopentyl and cyclohexyl. The percentage of hydrogen atoms substituted with a fluorine atom on the alkyl group is usually 80% or more, preferably 90% or more, and more preferably 100%. In a case where the substitution rate of fluorine atoms is less than 80%, the acid strength of the onium fluorinated alkylfluorophosphoric acid salt represented by the above general formula (b5) is decreased.

Particularly preferred $R^{b13}$ is linear or branched perfluoroalkyl groups having 1 to 4 carbon atoms in which the substitution rate of fluorine atoms is 100%, and specific examples include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{b13}$, j, is an integer of 1 to 5, preferably 2 to 4, and in particular preferably 2 or 3.

Specific examples of the preferred fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$ or $[(CF_3CF_2CF_2)_3PF_3]^-$. Among these, particularly preferred are $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]$ or $[((CF_3)_2CFCF_2)_2PF_4]^-$.

Preferred and specific examples of the borate anion represented by the above general formula (b22) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), tetrakis(difluorophenyl)borate ($[B(C_6H_3F_2)_4]^-$) and the like. Among these, tetrakis(pentafluorophenyl)borate ($[B(C_6F_5)_4]^-$) is particularly preferred.

The photo-acid generators according to the second aspect include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxypheny)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine; and halogen-containing triazine compounds represented by the following general formula (b7) such as tris(2,3-dibromopropyl)isocyanurate.

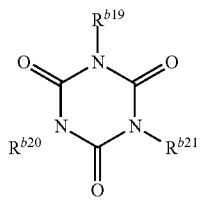

(b7)

In the above general formula (b7), $R^{b19}$, $R^{b20}$ and $R^{b21}$ each independently represents a halogenated alkyl group.

The photo-acid generators according to the third aspect include α-(p-toluenesulfonyloximino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and the compounds represented by the following general formula (b8) containing an oxime-sulfonate group.

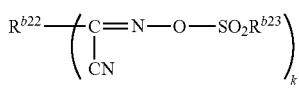

(b8)

In the above general formula (b8), $R^{b22}$ represents a monovalent, divalent, or trivalent organic group, and $R^{b23}$ represents a substituted or unsubstituted saturated hydrocarbon group, an unsaturated hydrocarbon group or an aromatic compound group. k is the number of repeating unit represented by the structure in parentheses.

In the above general formula (b8), an aromatic compound group refers to a group derived from a compound showing physical and chemical properties characteristic to aromatic compounds, including, for example, aryl groups such as a phenyl group and a naphthyl group; heteroaryl groups such as a furyl group and a thienyl group. These may have one or more suitable substituents on a ring, for example, a halogen atom, an alkyl group, an alkoxy group, a nitro group and the like. In particular $R^{b23}$ is preferably an alkyl group having 1 to 6 carbon atoms, including a methyl group, an ethyl group, a propyl group and a butyl group. In particular, a compound in which $R^{b22}$ is an aromatic compound group and $R^{b23}$ is an alkyl group having 1 to 4 carbon atoms is preferred.

Acid generators represented by the above general formula (b8) include compounds in which $R^{b22}$ is any of a phenyl group, a methylphenyl group or a methoxyphenyl group, and $R^{b23}$ is a methyl group when k=1. Specifically, they include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Specifically, the photo-acid generators represented by the above general formula (b8) when n=2 include the photo-acid generators represented by the following formula.

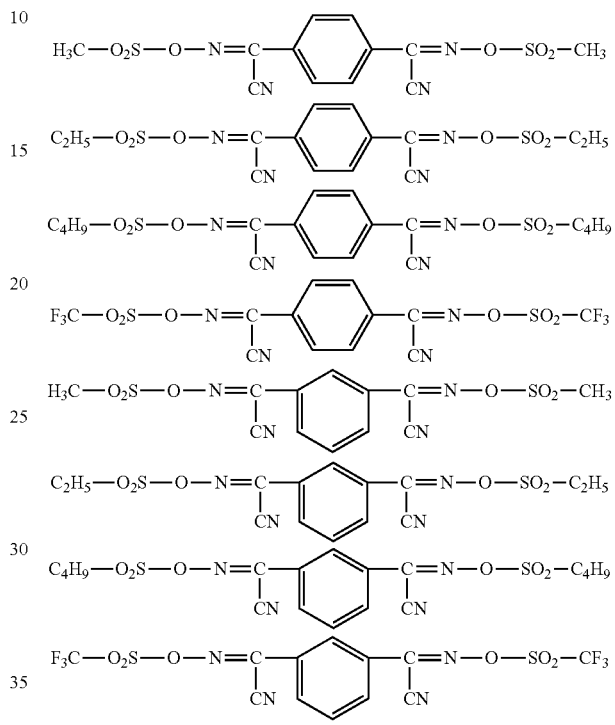

The photo-acid generators according to the fourth aspect include onium salts having a naphthalene ring on the cation portion. The phrase "having a naphthalene ring" refers to having a structure derived from naphthalene, meaning that the structure of at least two rings and the aromaticity thereof are maintained. The naphthalene ring may have a substituent such as a linear or branched alkyl group having 1 to 6 carbon atoms, a hydroxyl group and a linear or branched alkoxy group having 1 to 6 carbon atoms. The structure derived from a naphthalene ring may be a monovalent group (the free valency is 1) or a divalent (the free valency is 2) or higher group, but a monovalent group is preferred (however, in this case, the free valency shall be counted except for a portion to be attached to the above substituent). The number of naphthalene rings is preferably 1 to 3.

For a cation portion of an onium salt having a naphthalene ring at the foregoing cation portion, the structure represented by the following general formula (b9) is preferred.

(b9)

In the above general formula (b9), at least one of $R^{b24}$, $R^{b25}$ and $R^{b26}$ represents a group represented by the following general formula (b10). The remainder represents a linear or branched alkyl group having 1 to 6 carbon atoms, an optionally substituted phenyl group, a hydroxyl group or a linear or branched alkoxy group having 1 to 6 carbon atoms. Alternatively, one of $R^{b24}$, $R^{b25}$ and $R^{b26}$ is a group represented by the following general formula (b10), and the two remaining groups are each independently a linear or branched alkylene group having 1 to 6 carbon atoms, the ends of which may join together to become cyclic.

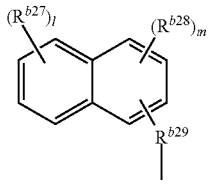
(b10)

In the above general formula (b10), $R^{b27}$ and $R^{b28}$ each independently represents a hydroxyl group, a linear or branched alkoxy group having 1 to 6 carbon atoms or a linear or branched alkyl group having 1 to 6 carbon atoms. $R^{b29}$ represents a linear or branched alkylene group having 1 to 6 carbon atoms which may have a single bond or a substituent.

l and m each independently represents an integer of 0 to 2, and l+m is 3 or less. In a case where two or more $R^{b27}$ are present, they may be the same or different from each other. In a case where two or more $R^{b28}$ are present, they may be the same or different from each other.

The number of the group represented by the above general formula (b10) among the above $R^{b24}$, $R^{b25}$ and $R^{b26}$ is preferably 1 in view of the stability of the compound, and the remainder is a linear or branched alkylene group having 1 to 6 carbon atoms, the ends of which may join together to become cyclic. In this case, the above two alkylene groups form a 3- to 9-membered ring including a sulfur atom. The number of atoms (including a sulfur atom) constituting a ring is preferably 5 to 6.

Optional substituents on the above alkylene group include an oxygen atom (which forms a carbonyl group along with a carbon atom constituting the alkylene group), a hydroxyl group and the like.

Optional substituents on the phenyl group include a hydroxyl group, a linear or branched alkoxy group having 1 to 6 carbon atoms, a linear or branched alkyl group having 1 to 6 carbon atoms and the like.

Those suitable as these cation portions can include those represented by the following formulae (b11) and (b12), and the structure represented by the following formula (b12) is particularly preferred.

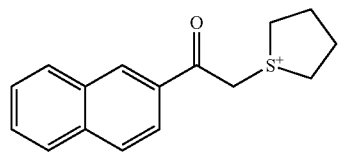
(b11)

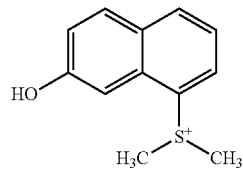
(b12)

The foregoing cation portion may be an iodonium salt or a sulfonium salt, but a sulfonium salt is preferred in view of acid generating efficiency and the like.

Therefore, for those suitable as an anion portion of an onium salt having a naphthalene ring at the cation portion, an anion which can form a sulfonium salt is preferred.

The foregoing anion portion of an acid generator is a fluoroalkylsulfonic acid ion or arylsulfonic acid ion in which some or all of the hydrogen atoms are fluorinated.

An alkyl group on the fluoroalkylsulfonic acid ion may be linear, branched or cyclic. The number of carbon atoms of the above alkyl group is preferably 1 to 20, more preferably 1 to 10 in view of the bulkiness and diffusion length of generated acid. In particular, a branched or cyclic alkyl group is preferred in view of short diffusion length of generated acid. Further, preferred examples of the above alkyl group can include a methyl group, an ethyl group, a propyl group, a butyl group, an octyl group and the like because fluoroalkylsulfonic acid can be inexpensively synthesized.

The aryl group in the arylsulfonic acid ion is an aryl group having 6 to 20 carbon atoms. The above aryl groups include a phenyl group and a naphthyl group which may be or may not be substituted with an alkyl group or a halogen atom. In particular, an aryl group having 6 to 10 carbon atoms is preferred because arylsulfonic acid can be inexpensively synthesized. Preferred and specific examples of the aryl group can include a phenyl group, a toluenesulfonyl group, an ethylphenyl group, a naphthyl group, a methylnaphthyl group and the like.

In the above fluoroalkylsulfonic acid ion or an arylsulfonic acid ion, a fluorination rate when some or all of the hydrogen atoms are fluorinated is preferably 10 to 100%, more preferably 50 to 100%. In particular, those in which the hydrogen atoms are all substituted with fluorine atoms are preferred because the strength of generated acid is high. Specific examples of these include trifluoromethanesulfonate, perfluorobutanesulfonate, perfluorooctanesulfonate, perfluorobenzenesulfonate and the like.

Among these, preferred anion portions include those represented by the following general formula (b13).

$R^{b30}SO_3^-$ (b13)

In the above general formula (b13), $R^{b30}$ is a group represented by the following general formula (b14), a group represented by the following general formula (b15), or a group represented by the following formula (b16).

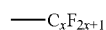
—$C_xF_{2x+1}$ (b14)

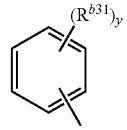
(b15)

(b16)

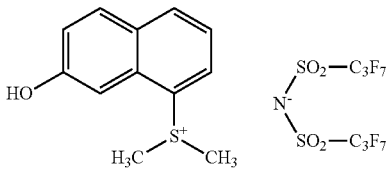
(b20)

In the above general formula (b14), x represents an integer of 1 to 4. In the above general formula (b15), $R^{b31}$ represents a hydrogen atom, a hydroxyl group, a linear or branched alkyl group having 1 to 6 carbon atoms or a linear or branched alkoxy group having 1 to 6 carbon atoms, and y represents an integer of 1 to 3. Among these, trifluoromethanesulfonate, perfluorobutanesulfonate are preferred in view of safety.

For the anion portions, those containing nitrogen represented by the following general formula (b17) or (b18) can also be used.

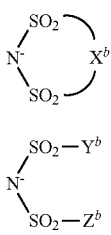
(b17)

(b18)

In the above general formula (b17) or (b18), $X^b$ represents a linear or branched alkylene group in which at least one hydrogen atom is substituted with a fluorine atom, and the number of carbon atoms of the above alkylene group is preferably 2 to 6, more preferably 3 to 5, and most preferably 3. $Y^b$, $Z^b$ each independently represents a linear or branched alkyl group in which at least one hydrogen atom is substituted with a fluorine atom, and the number of carbon atoms of the above alkyl group is 1 to 10, preferably 1 to 7, and more preferably 1 to 3.

The number of carbon atoms of the alkylene group on $X^b$, or the number of carbon atoms of the alkyl group on $Y^b$, $Z^b$ is preferably small because the smaller is the number, the better is the solubility into an organic solvent.

In the alkylene group on $X^b$ or the alkyl group on $Y^b$, $Z^b$, the number of hydrogen atoms substituted with fluorine atoms is preferably large because the larger the number is, the higher the acid strength is. The proportion of fluorine atoms in the above alkylene group or the alkyl group, i.e., the fluorination rate is preferably 70 to 100%, more preferably 90 to 100%. Most preferred is a perfluoroalkylene group or a perfluoroalkyl group in which the hydrogen atoms are all substituted with fluorine atoms.

Preferred onium salts having a naphthalene ring at the foregoing cation portion include those compounds represented by the following formulae (b19) and (b20).

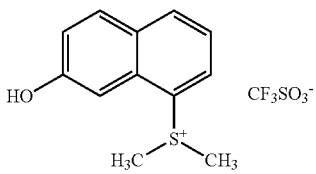
(b19)

The photo-acid generators according to the fifth aspect include bissulfonyldiazomethanes such as bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane; nitrobenzyl derivatives such as p-toluenesulfonic acid 2-nitrobenzyl, p-toluenesulfonic acid 2,6-dinitrobenzyl, nitrobenzyltosylate, dinitrobenzyltosylate, nitrobenzylsulfonate, nitrobenzylcarbonate, dinitrobenzylcarbonate; sulfonates such as pyrogallol trimesylate, pyrogallol tritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethanesulfonates such as N-hydroxyphthalimide and N-hydroxynaphthalimide; onium salts such as diphenyliodonium hexafluorophosphate, (4-methoxypheny)phenyliodonium trifluoromethanesulfonate, bis(p-tert-butylphenyl)iodonium trifluoromethanesulfonate, triphenylsulfonium hexafluorophosphate, (4-methoxypheny)diphenylsulfonium trifluoromethanesulfonate, (p-tert-butylphenyl)diphenylsulfonium trifluoromethanesulfonate; benzoin tosylates such as benzoin tosylate and α-methylbenzoin tosylate; other diphenyliodonium salts, triphenylsulfonium salts, phenyldiazonium salt, benzylcarbonate and the like.

The content of the component (B) in the photosensitive resin composition is preferably 0.01 to 20 parts by mass relative to 100 parts by mass of the component (A), more preferably 0.05 to 5 parts by mass, and in particular preferably 0.05 to 5 parts by mass. In a case where the photosensitive resin composition contains the foregoing amount of the component (B), a pattern in which its shape is not easily changed over time can be easily formed in excellent precision by low light exposure.

[(C) Compounds which Generate an Imidazole Compound by Light]

The photosensitive resin composition contains a compound which can generate an imidazole compound represented by the following general formula (C1) by light (hereinafter, referred to as the compound (c)).

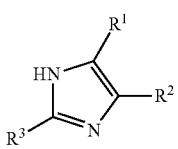
(c1)

In the general formula (c1), $R^1$, $R^2$ and $R^3$ each independently represents a hydrogen atom, a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group.

Since the photosensitive resin composition according to the present invention contains the component (C), an imidazole compound can be generated from the component (C) only at an exposed portion by the action of light at selective exposure. An imidazole compound can promote the condensation of the component (A). But in a case where the photosensitive resin composition according to the present invention contains the component (C), an imidazole compound will not be generated in the photosensitive resin composition until exposure. Therefore, the photosensitive resin composition shows good storage stability.

Organic groups on $R^1$, $R^2$ and $R^3$ include an alkyl group, an alkenyl group, a cycloalkyl group, a cycloalkenyl group, an aryl group, an aralkyl group and the like. This organic group may include a bond or a substituent such as a hetero atom and the like other than hydrocarbon groups in the organic group. This organic group may be either liner, branched, or cyclic. This organic group is usually monovalent, but can be divalent or higher valent in a case where it forms a cyclic structure.

$R^1$ and $R^2$ may join together to form a cyclic structure, and they may further include a bond of a hetero atom. The cyclic structures include a heterocycloalkyl group, a heteroaryl group and the like, and they may be a condensed ring.

There is no particular limitation for the bond included in the organic group of $R^1$, $R^2$ and $R^3$ as long as the effect of the present invention is not compromised, but the organic group may include a bond comprising a hetero atom such as an oxygen atom, a nitrogen atom and a silicon atom. Specific examples of the bond comprising a hetero atom include an ether bond, a thioether bond, a carbonyl bond, a thiocarbonyl bond, an ester bond, an amide bond, an urethane bond, an imino bond (—N=C(—R)—, —C(=NR)—: R represents a hydrogen atom or an organic group), a carbonate bond, a sulfonyl bond, a sulfinyl bond, an azo bond and the like.

For the bonds comprising an hetero atom which the organic group of $R^1$, $R^1$ and $R^3$ may have, preferred are an ether bond, a thioether bond, a carbonyl bond, a thiocarbonyl bond, an ester bond, an amide bond, an urethane bond, an imino bond (—N=C(—R)—, —C(=NR)—: R represents a hydrogen atom or a monovalent organic group), a carbonate bond, a sulfonyl bond and sulfinyl bond in view of the thermal resistance of the imidazole compound.

In a case where $R^1$, $R^2$ and $R^3$ are substituents other than a hydrocarbon group, there is no particular limitation for $R^1$, $R^2$ and $R^3$ as long as the effect of the present invention is not compromised. Specific examples of $R^1$, $R^2$ and $R^3$ include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, a carbamoyl group, a thiocarbamoyl group, a nitro group, a nitroso group, a carboxylate group, an acyl group, an acyloxy group, a sulfino group, a sulfonato group, a phosphino group, a phosphinyl group, a phosphonato group, an alkylether group, an alkenylether group, an alkylthioether group, an alkenylthioether group, an arylether group, an arylthioether group and the like. A hydrogen atom included in the above substituents may be substituted with a hydrocarbon group. A hydrocarbon group included in the above substituents may be either liner, branched, or cyclic.

For $R^1$, $R^2$ and $R^3$, a hydrogen atom, an alkyl group having 1 to 12 carbon atoms, an aryl group having 1 to 12 carbon atoms, an alkoxy group having 1 to 12 carbon atoms and a halogen atom are preferred, and a hydrogen atom is more preferred. Since an imidazole compound in which $R^1$, $R^2$ and $R^3$ are all hydrogen atoms has a simple structure with little steric hindrance, the imidazole compound can easily attack the carbonyl group included in the imido group on the polyimide resin (A).

There is no particular limitation for the component (C) as long as it can generate an imidazole compound represented by the above general formula (c1) by the action of light. In a compound conventionally compounded in a photosensitive composition, which can generate amine by the action of light, the backbone from the amine generated upon exposure can be replaced with the backbone from the imidazole compound represented by the above general formula (c1) to obtain a compound used as the component (C).

The suitable components (C) include compounds represented by the following general formula (c2).

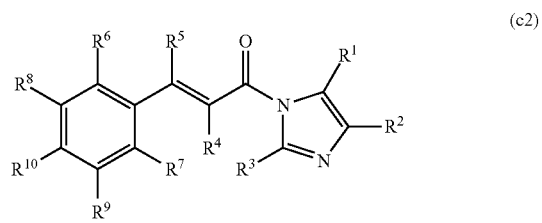

(c2)

In the general formula (c2), $R^1$, $R^2$ and $R^3$ each independently represents a hydrogen atom, a halogen atom, a hydroxyl group, a mercapto group, a sulfide group, a silyl group, a silanol group, a nitro group, a nitroso group, a sulfonato group, a phosphino group, a phosphinyl group, a phosphonato group or an organic group. $R^4$ and $R^5$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group or an organic group. $R^6$, $R^7$, $R^8$, $R^9$ and $R^{10}$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group or an organic group. Two or more of $R^6$, $R^7$, $R^8$, $R^9$ and $R^{10}$ may join together to form a cyclic structure, or may include a bond of a hetero atom.

In the general formula (c2), $R^1$, $R^2$ and $R^3$ are the same as those described for the general formula (c1).

In the general formula (c2), $R^4$ and $R^5$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group or an organic group.

Organic groups on $R^4$ and $R^5$ include those exemplified for $R^1$, $R^2$ and $R^3$. These organic groups may include a hetero atom in the organic groups as in $R^1$, $R^2$ and $R^3$. These organic groups may be either liner, branched, or cyclic.

Among these, preferably, $R^4$ and $R^5$ are each independently a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, an alkyl group having 2 to 11 carbon atoms which has a cyano group, an alkyl group having 1 to 10 carbon atoms which has a hydroxyl group, an alkoxy group having 1 to 10 carbon atoms, an amide group having 2 to 11 carbon atoms, an alkylthio group having 1 to 10 carbon atoms, an acyl group having 1 to 10 carbon atoms, an ester group having 2 to 11 carbon atoms (—COOR, —OCOR: R represents a hydrocarbon group), an aryl group having 6 to 20 carbon atoms, an aryl group having 6 to 20 carbon atoms substituted with an electron-donating group and/or an electron-withdrawing group, a benzyl group substituted with an electron-donating group and/or an electron-withdrawing group, a cyano group and a methylthio group. More preferably, $R^4$ and $R^5$ are both hydrogen atoms, or $R^4$ is a methyl group and $R^5$ is a hydrogen atom.

In the general formula (c2), $R^6$, $R^7$, $R^8$, $R^9$ and $R^{10}$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group or an organic group.

Organic groups on $R^6$, $R^7$, $R^8$, $R^9$ and $R^{10}$ include those exemplified for $R^1$, $R^2$ and $R^3$. This organic group may include a bond or a substituent of a hetero atom and the like in the organic group other than those of hydrocarbon groups as in $R^1$ and $R^2$. This organic group may be either liner, branched, or cyclic.

Two or more of $R^6$, $R^7$, $R^8$, $R^9$ and $R^{10}$ may join together to form a cyclic structure, or may include a bond of a hetero atom. Cyclic structures include a heterocycloalkyl group, a heteroaryl group and the like, and they may be a condensed ring. For example, two or more of $R^6$, $R^7$, $R^8$, $R^9$ and $R^{10}$ may join to form a condensed ring such as naphthalene, anthracene, phenanthrene and indene by sharing the atoms of the benzene ring to which $R^6$, $R^7$, $R^8$, $R^9$ and $R^{10}$ are attached.

Among these, preferably $R^6$, $R^7$, $R^8$, $R^9$ and $R^{10}$ are each independently a hydrogen atom, an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms, an aralkyl group having 7 to 20 carbon atoms, an alkyl group having 2 to 11 carbon atoms which has a cyano group, an alkyl group having 1 to 10 carbon atoms which has a hydroxyl group, an alkoxy group having 1 to 10 carbon atoms, an amide group having 2 to 11 carbon atoms, an alkylthio group having 1 to 10 carbon atoms, an acyl group having 1 to 10 carbon atoms, an ester group having 2 to 11 carbon atoms, an aryl group having 6 to 20 carbon atoms, an aryl group having 6 to 20 carbon atoms substituted with an electron-donating group and/or an electron-withdrawing group, a benzyl group substituted with an electron-donating group and/or an electron-withdrawing group, a cyano group, a methylthio group and a nitro group.

A case where two or more of $R^6$, $R^7$, $R^8$, $R^9$ and $R^{10}$ join together to form a condensed ring such as naphthalene, anthracene, phenanthrene and indene by sharing the atoms of the benzene ring to which $R^6$, $R^7$, $R^8$, $R^9$ and $R^{10}$ are attached is preferred because the absorption wavelength is shifted toward a longer wavelength.

Among the compounds represented by the above general formula (c2), Compounds represented by the following general formula (c3) are preferred.

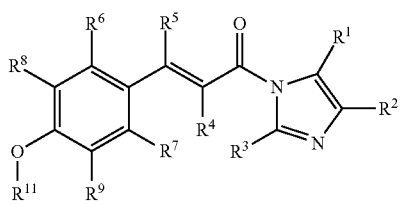

(c3)

In the general formula (c3), $R^1$, $R^2$ and $R^3$ are used synonymously with those in the general formulae (c1) and (c2). $R^4$ to $R^9$ are used synonymously with those in the general formula (c2). $R^{11}$ represents a hydrogen atom or an organic group. $R^6$ and $R^7$ shall not be a hydroxyl group. Two or more of $R^6$, $R^7$, $R^8$ and $R^9$ may join together to form a cyclic structure, or may include a bond of a hetero atom.

The compounds represented by the general formula (c3) can be easily dissolved in a photosensitive resin composition uniformly because they have a substituent of —O—$R^{11}$.

In the general formula (c3), $R^{11}$ is a hydrogen atom or an organic group. In a case where $R^{11}$ is an organic group, those exemplified in $R^1$, $R^2$ and $R^3$ may be referred as the organic group. This organic group may include a hetero atom in the organic group. This organic group may be either liner, branched, or cyclic. For $R^{11}$, a hydrogen atom or an alkyl group having 1 to 12 carbon atoms is preferred, and a methyl group is more preferred.

Specific examples of the compounds particularly suitable for the component (C) are shown in below.

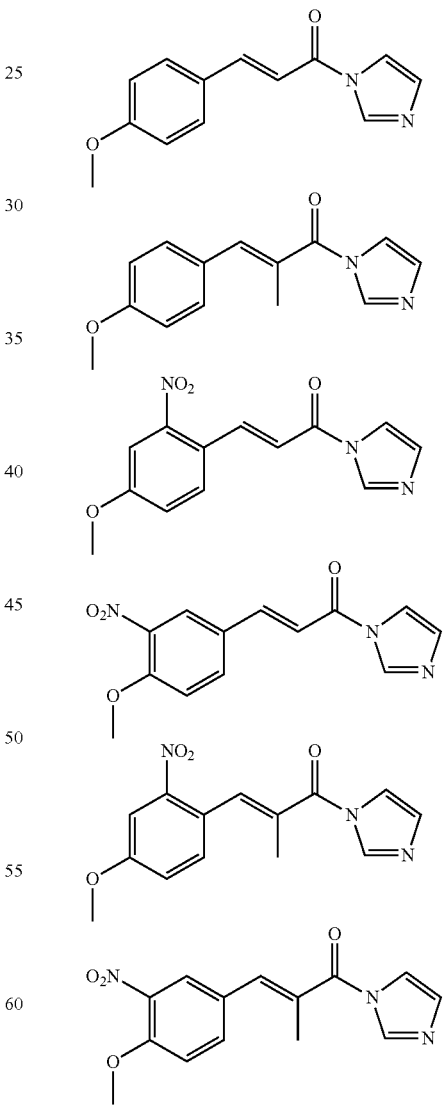

There is no particular limitation for the content of the component (C) in the photosensitive resin composition as long as it does not interfere with the object of the present invention. The content of the component (C) in the positive-type photosensitive resin composition is preferably 0.05 to 10 parts by mass relative to 100 parts by mass of the component (A), more preferably 1 to 5 parts by mass.

[(D) Reactive Diluent]

The photosensitive resin composition may comprise a reactive diluent (D) (hereinafter also referred to as the component (D)). In a case where the photosensitive resin composition comprises the reactive diluent (D), the contraction can be suppressed and the mechanical strength can be improved for the exposed photosensitive resin composition.

For the reactive diluent (D), at least one of a cationic polymerizable monomer and an ethylene based unsaturated monomer is preferably used. The cationic polymerizable monomer is an organic compound which undergoes a polymerization reaction or a cross-linking reaction upon exposure to light in the presence of a photo-acid generator. The cationic polymerizable monomers include an epoxy compound, an oxetane compound, an oxolane compound, a cyclic acetal compound, a cyclic lactone compound, a thiirane compound, a thietane compound, a vinyl ether compound, a spiro ortho ester compound which is a reaction product of an epoxy compound and lactone, an ethylene based unsaturated compound, a cyclic ether compound, a cyclic thioether compound, a vinyl compound and the like. The cationic polymerizable monomers can also be used in combination of two or more.

There is no particular limitation for the ethylene based unsaturated monomer as long as it is a compound having an ethylene based unsaturated bond in the molecule. For example, preferred are a monofunctional monomer having one ethylene based unsaturated bond per molecule, and a polyfunctional monomer having two or more ethylene based unsaturated bonds per molecule.

There is no particular limitation for the content of the component (D) in the photosensitive resin composition. The content of the component (D) is preferably 0.1 to 100 parts by mass relative to 100 parts by mass of the component (A), more preferably 0.5 to 80 parts by mass, and in particular preferably 1 to 50 parts by mass. When the content of the component (D) in the photosensitive resin composition is too small, desired effects may not be obtained by addition of the component (D). When the content of the component (D) in the photosensitive resin composition is too large, the curability of the photosensitive resin composition as well as the transparency and thermal resistance of cured products such as a siloxane coating formed by exposing the photosensitive resin composition may be decreased.

[(E) Organic Solvent]

The photosensitive resin composition may comprise an organic solvent (E) (hereinafter also referred to as the component (E)). When a photosensitive resin composition contains the organic solvent (E), excellent storage stability can be easily conferred on the photosensitive resin composition. Further, the viscosity of a photosensitive resin composition can be adjusted by allowing the photosensitive resin composition to contain the organic solvent (E). By compounding a photosensitive resin composition with an organic solvent (E) to adjust viscosity, the applicability of the photosensitive resin composition can be improved, and the thickness of a coating film can be adjusted when applying the photosensitive resin composition to form the coating film.

There is no particular limitation for the organic solvent (E) as long as it does not interfere with the object of the present invention. Preferred and specific examples of the organic solvent (E) include monohydric alcohols such as methyl alcohol, ethyl alcohol, propyl alcohol, butyl alcohol, 3-methoxy-3-methyl-1-butanol and 3-methoxy-1-butanol; alkylcarboxylic acid esters such as methyl-3-methoxypropionate and ethyl-3-ethoxypropionate; polyhydric alcohols such as ethylene glycol, diethylene glycol and propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate and propylene glycol monoethyl ether acetate; fatty acids such acetic acid and propionic acid; ketones such as acetone, methyl ethyl ketone and 2-heptanone; and the like. The organic solvents (E) can be used in combination of two or more.

There is no particular limitation for the amount of the organic solvent (E) in the photosensitive resin composition, but an amount preferred is such that the concentration of the solid contents in the photosensitive resin composition is 5% by mass or more, and more preferably 20 to 50% by mass.

Methods of Forming a Pattern

There is no particular limitation for the method of forming a pattern using the photosensitive resin composition described above. Preferred methods of forming a pattern include a method comprising: the coating film forming step of applying the aforementioned photosensitive resin composition on a substrate to form a coating film; the exposure step of exposing the coating film to a predetermined pattern; and the development step of removing unexposed portions of the coating film for development.

There is no particular limitation for the methods of applying a photosensitive resin composition on a substrate as long as the methods can form a coating film of a desired film. The methods of applying a photosensitive resin composition on a substrate include methods in which contact transfer coating applicators such as a roll coater, a reverse coater and a bar coater; and non-contact coaters such as a spinner (a rotary applicator) and a curtain flow coater are used. When the photosensitive resin composition comprises the solvent (E), a coating film formed on the substrate may be heated to remove the solvent (E) from the coating film, if desired. The thickness of a coating film is preferably 0.05 to 20 μm, more preferably 0.05 to 5 μm.

The coating film formed by the methods described above is selectively exposed depending on a design of the pattern to be formed. Selective exposure is usually performed through a mask having a shape corresponding to the design of the pattern. Examples of radiation used for the exposure include, for example, ultraviolet rays, electron beams, laser beams and the like emitted from a low-pressure mercury lamp, a high-pressure mercury lamp, a metal halide lamp, a g-line stepper, an i-line stepper and the like. The amount of exposure may vary depending on the light source to be used, the thickness of a coating film and the like, but is usually 1 to 1000 mJ/cm$^2$, and preferably 10 to 500 mJ/cm$^2$.

After exposure, for example, using developing solution such as an aqueous solution of tetramethylammonium hydroxide, and potassium hydroxide, unexposed portions are removed to develop a pattern. The developed pattern is heated and dried, if desired, to form a pattern comprising a polysiloxane coating. The pattern comprising a polysiloxane coating formed as described above can be used as an insulator or an optical material to obtain various electronic components.

EXAMPLES

Below, the present invention will be described in detail using Examples, but the present invention is not limited to these Examples.

In Examples and Comparative Examples, the polysiloxane contained in the polysiloxane solution SI-1 and SI-2 which were obtained according to the methods described in Synthesis Examples 1 and 2 was used as the component (A). The following curing accelerators were used in Examples and Comparative Examples.

A: the compound of the following formula (C-1) obtained according to the method described in Synthesis Example 3 below.

B: imidazole

C: an aqueous solution of tetramethylammonium nitrate in a concentration of 2.38% by mass

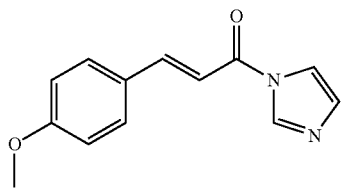

C-1

Synthesis Example 1

To a reaction vessel, 53.4 g of tetraethoxysilane, 91.9 g of methyltriethoxysilane, 40 g of ion exchange water and 0.03 g of oxalic acid are added. The content of the reaction vessel was stirred at 60° C. for 6 hours to allow the hydrolytic condensation reaction of tetraethoxysilane and methyltriethoxysilane to take place. Subsequently, after adding 363.3 g of diethylene glycol dimethyl ether to the vessel, diethylene glycol dimethyl ether and ethanol produced by hydrolysis were removed using an evaporator. The residue condensed by the evaporator was heated in a 60° C. water bath for 6 hours to yield 241.1 g of the polysiloxane solution having a solid content concentration of 60% by mass. The average molecular weight of the polysiloxane contained in the resulting polysiloxane solution (SI-1) was 780.

Synthesis Example 2

A polysiloxane solution (211.2 g) having a solid content concentration of 60% by mass was obtained as in Synthesis Example 1 except that phenyltrimethoxysilane was substituted for tetraethoxysilane, and the conditions under which the residue condensed by the evaporator was heated were changed to 90° C. and 10 hours. The average molecular weight of the polysiloxane contained in the resulting polysiloxane solution (SI-2) was 5600.

Synthesis Example 3

5.90 g (30 mmol) of 3-(4-methoxypheny)acrylic acid chloride was dissolved in 50 ml of dry ether, and 4.59 ml of triethylamine (equivalent ratio: 1.1) and 2.25 ml of imidazole (equivalent ratio: 1.1) were added. Subsequently, a reaction solution was stirred at the room temperature for 1 hour. The reaction solution was washed with 50 ml of water, 50 ml of a saturated aqueous NaHCO$_3$ solution and 1 N hydrochloric acid, and then dried over magnesium sulfate, and condensed under reduced pressure. Purification was performed using hexane-ethyl acetate as a developing solvent by column chromatography where silica gel was used as a support to obtain C-1 (3.41 g, 15 mmol). The yield was 50% in terms of acrylic acid chloride equivalence.

Examples 1 to 3 and Comparative Examples 1 to 3

Polysiloxane solutions of kinds described in Table 1 of 100 parts by mass, a photo-base generator (IRGACURE OXE-02, an oxime ester based compound, BASF) of 1.0 parts by mass, curing accelerators of kinds described in Table 1 of 1.0 parts by mass and a dehydrating agent (methyl orthoformate) of 3.0 parts by mass were uniformly mixed to obtain the photosensitive resin compositions for Examples 1 to 3 and Comparative Examples 1 to 3. In Examples, the curing accelerators correspond to the component (C).

[Evaluation of Pattern Accuracy]

The photosensitive resin composition of 2 mL was dropped on a 5-inch silicon wafer at the center, and a coating film was formed on the silicon wafer by the spin application method (spinning for 30 seconds at 700 revolutions per minute). The formed coating film was dried on a 100° C. hot plate for 60 seconds. Ultraviolet light was irradiated on the dried coating film through a negative mask having a line-like pattern with a minimum line width of 10 μm using an exposure device (MPA-600FA, Canon Inc.) at an exposure amount shown in Table 1. The silicon wafer comprising the coating film after exposure was heated for 60 seconds at 100° C., and then the silicon wafer was naturally-cooled to the room temperature. Then, the silicon wafer was immersed in a developing solution which comprises an aqueous solution of tetramethylammonium hydroxide having a concentration of 2.38% by mass for 30 seconds to dissolve unexposed portions. Then, the silicon wafer was washed with water, and dried by spin drying to form a pattern comprising a polysiloxane coating.

To evaluate pattern accuracy, the shape of the pattern comprising a polysiloxane coating immediately after development was compared with that of the pattern comprising a polysiloxane coating after the silicon wafer having the pattern comprising a polysiloxane coating was left to stand for 1 week under the clean room environment (the room temperature: 24° C., humidity: 40%). Note that the shape of the pattern was evaluated by the observation of the upper side of the pattern using an optical microscope, and the observation from the side of the pattern using SEM. "Good" was assigned in a case where the shape of the pattern after left to stand for 1 week was similar to that before left to stand for 1 week. "Bad" was assigned in a case where the shape of the pattern after left to stand for 1 week was different from that before left to stand for 1 week. The results from the evaluation of pattern accuracy are shown in Table 1.

[Evaluation of Storage Stability]

The photosensitive resin composition immediately after preparation was left to stand for 1 week under the clean room environment (the room temperature: 24° C., humidity: 40%). The procedure of forming a pattern was performed on a 5-inch silicon wafer using the photosensitive resin composition after left to stand for 1 week as in the evaluation of pattern accuracy. "Good" was assigned in a case where a predetermined shape of the pattern was formed. "Bad" was assigned in a case where a predetermined shape of the pattern was not formed. The results from the evaluation of storage stability are shown in Table 1.

TABLE 1

| | Polysiloxane solution | Curing accelerator | Exposure amount (mJ/cm²) | Pattern accuracy | Storage stability |
|---|---|---|---|---|---|
| Example 1 | SI-1 | A | 100 | Good | Good |
| Example 2 | SI-1 | A | 100 | Good | Good |
| Example 3 | SI-2 | A | 100 | Good | Good |
| Comparative Example 1 | SI-1 | B | 200 | Good | Bad |
| Comparative Example 2 | SI-2 | B | 100 | Good | Bad |
| Comparative Example 3 | SI-1 | C | 200 | Bad | Bad |

According to Examples 1 to 3, it can be understood that a photosensitive resin composition comprising a given component (A), component (B) and component (C) can form a pattern showing no change in the shape over time and having excellent precision. Also, it can be understood that a pattern having a desired shape can be formed even after the photosensitive resin composition is stored for a given period of time.

According to Comparative Examples 1 and 2, it can be understood that in a case where a photosensitive resin composition comprising imidazole as a curing accelerator instead of the compound represented by the above general formula (c1) is used, a pattern having a desired shape can not be formed after the photosensitive resin composition is stored for a given period of time because imidazole accelerates the condensation of the component (A) during the storage of the photosensitive resin composition.

According to Comparative Example 3, it can be understood that in a case where a photosensitive resin composition comprising tetramethylammonium nitrate as a curing accelerator is used, a pattern showing excellent pattern accuracy can not be formed by a similar exposure amount as that in Examples, and a pattern having a desired shape can not be formed after the photosensitive resin composition is stored for a given period of time.

What is claimed is:

1. A photosensitive resin composition comprising:
(A) one or more selected from the group consisting of hydrolyzable silane compounds represented by the following general formula:

wherein, in the general formula (1), R represents a hydrogen atom or an organic group having 1 to 20 carbon atoms, X represents a hydrolyzable group and n is an integer of 0 to 2,
hydrolysates of the hydrolyzable silane compounds and condensates thereof;
(B) a photo-base generator or a photo-acid generator; and
(C) a compound which generates an imidazole compound represented by the following general formula by light:

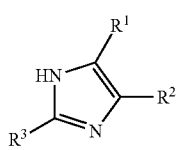

wherein, in the general formula (c1), $R^1$, $R^2$ and $R^3$ each independently represents a hydrogen atom, a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group.

2. The photosensitive resin composition according to claim 1,
wherein the compound which generates the imidazole compound (C) is a compound represented by the following formula:

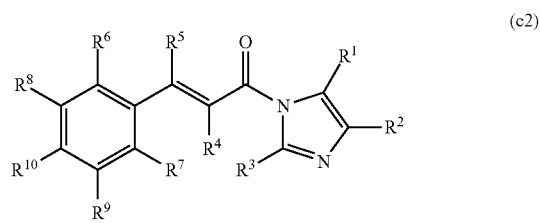

wherein, in the general formula (c2), $R^1$, $R^2$ and $R^3$ each independently represents a hydrogen atom, a halogen atom, a hydroxyl group, a mercapto group, a sulfide group, a silyl group, a silanol group, a nitro group, a nitroso group, a phosphino group, a sulfonato group, a phosphinyl group, a phosphonato group or an organic group,
$R^4$ and $R^5$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group or an organic group,
$R^6$, $R^7$, $R^8$, $R^9$ and $R^{10}$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group or an organic group, and
two or more of $R^6$, $R^7$, $R^8$, $R^9$ and $R^{10}$ may join together to form a cyclic structure, or may include a bond of a hetero atom.

3. The photosensitive resin composition according to claim 1, further comprising a reactive diluent (D).

4. The photosensitive resin composition according to claim 3, further comprising an organic solvent (E).

5. The photosensitive resin composition according to claim 1, further comprising an organic solvent (E).

6. A method of forming a pattern comprising a polysiloxane coating, the method comprising:
applying the photosensitive resin composition according to claim 1 on a substrate to form a coating film,
exposing the coating film to a predetermined pattern, and
removing unexposed portions of the coating film for development.

7. An electronic component comprising the pattern comprising a polysiloxane coating formed on the substrate by the method according to claim 6.

* * * * *